(12) United States Patent
Taluja et al.

(10) Patent No.: US 10,097,193 B2
(45) Date of Patent: *Oct. 9, 2018

(54) METHOD AND SYSTEM FOR TIME INTERLEAVED ANALOG-TO-DIGITAL CONVERTER TIMING MISMATCH ESTIMATION AND COMPENSATION

(71) Applicant: Maxlinear, Inc., Carlsbad, CA (US)

(72) Inventors: Pawandeep Taluja, Carlsbad, CA (US); Mingrui Zhu, Carlsbad, CA (US); Xuefeng Chen, Carlsbad, CA (US); Anand Anandakumar, Carlsbad, CA (US); Sheng Ye, Carlsbad, CA (US); Timothy Gallagher, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/812,365

(22) Filed: Nov. 14, 2017

(65) Prior Publication Data

US 2018/0069562 A1 Mar. 8, 2018

Related U.S. Application Data

(63) Continuation of application No. 15/436,088, filed on Feb. 17, 2017, now Pat. No. 9,825,640, which is a (Continued)

(51) Int. Cl.
*H03M 1/06* (2006.01)
*H04W 56/00* (2009.01)
(Continued)

(52) U.S. Cl.
CPC ....... *H03M 1/0612* (2013.01); *H03M 1/1009* (2013.01); *H03M 1/1215* (2013.01); *H03M 1/50* (2013.01); *H04W 56/00* (2013.01)

(58) Field of Classification Search
CPC ........ H03M 1/00; H03M 1/50; H03M 1/0612; H03M 1/1038; H03M 1/1215; H04L 7/0087; H04L 25/08; H04W 56/00
(Continued)

(56) References Cited

U.S. PATENT DOCUMENTS

| 7,330,140 B2* | 2/2008 | Balakrishnan ...... H03M 1/0624 341/118 |
| 7,916,050 B1* | 3/2011 | Mujica ................. H03M 1/004 341/118 |
| 7,916,051 B1* | 3/2011 | Sestok ................ H03M 1/1061 341/120 |

* cited by examiner

*Primary Examiner* — Jean B Jeanglaude
(74) *Attorney, Agent, or Firm* — McAndrews, Held & Malloy

(57) ABSTRACT

Methods and systems for time interleaved analog-to-digital converter timing mismatch calibration and compensation may include receiving an analog signal on a chip, converting the analog signal to a digital signal utilizing a time interleaved analog-to-digital-converter (ADC), and reducing a blocker signal that is generated by timing offsets in the time interleaved ADC by estimating complex coupling coefficients between a desired digital output signal and the blocker signal utilizing a decorrelation algorithm on frequencies within a desired frequency bandwidth. The decorrelation algorithm may comprise a symmetric adaptive decorrelation algorithm. The received analog signal may be generated by a calibration tone generator on the chip. An aliased signal may be summed with an output signal from a multiplier. The complex coupling coefficients may be determined utilizing the decorrelation algorithm on the summed signals. A multiplier may be configured to cancel the blocker signal utilizing the determined complex coupling coefficients.

20 Claims, 7 Drawing Sheets

Related U.S. Application Data continuation of application No. 14/920,699, filed on Oct. 22, 2015, now Pat. No. 9,577,655, which is a continuation of application No. 14/590,250, filed on Jan. 6, 2015, now Pat. No. 9,172,386, which is a continuation of application No. 13/936,385, filed on Jul. 8, 2013, now Pat. No. 8,928,507.

(60) Provisional application No. 61/668,813, filed on Jul. 6, 2012.

(51) Int. Cl.
*H03M 1/50* (2006.01)
*H03M 1/12* (2006.01)
*H03M 1/10* (2006.01)

(58) Field of Classification Search
USPC ........................................ 341/118–120, 155
See application file for complete search history.

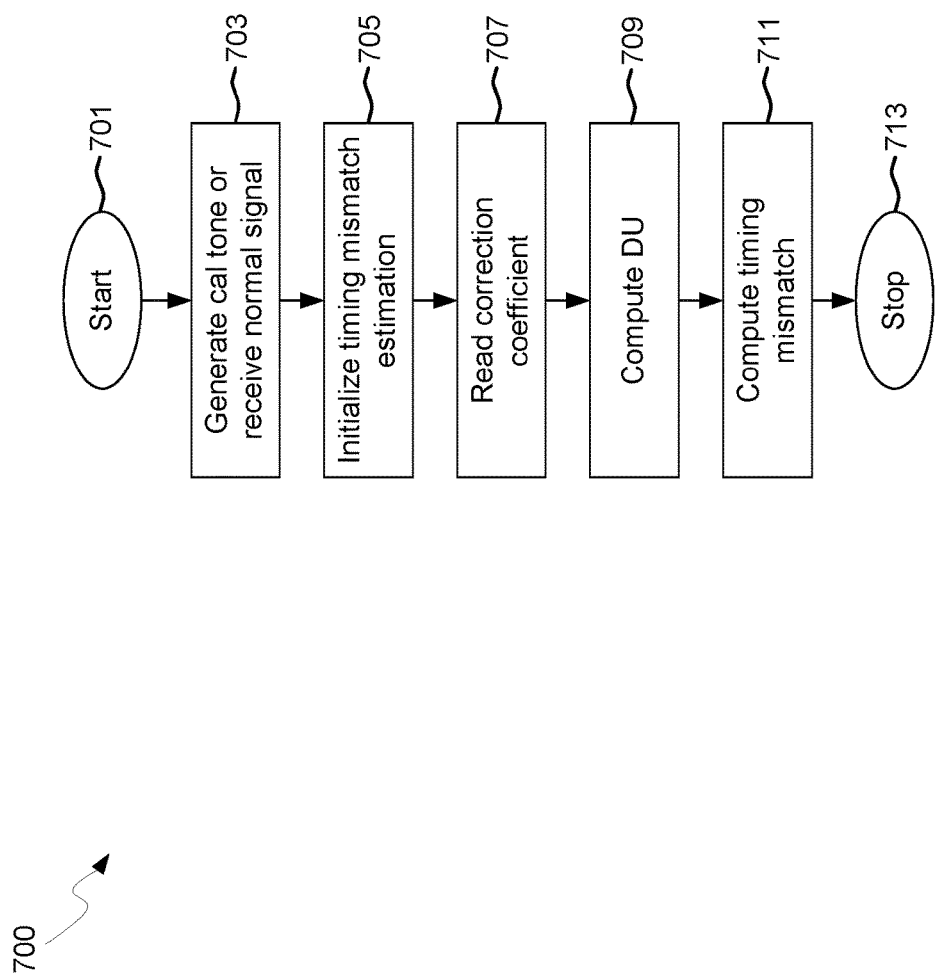

METHOD AND SYSTEM FOR TIME INTERLEAVED ANALOG-TO-DIGITAL CONVERTER TIMING MISMATCH ESTIMATION AND COMPENSATION

CROSS-REFERENCE TO RELATED APPLICATIONS/INCORPORATION BY REFERENCE

This application is a continuation of application Ser. No. 15/436,088 filed on Feb. 17, 2017, which is a continuation of application Ser. No. 14/920,699 filed on Oct. 22, 2015, now U.S. Pat. No. 9,577,655, which is a continuation of application Ser. No. 14/590,250 filed on Jan. 6, 2015, now U.S. Pat. No. 9,172,386, which is a continuation of application Ser. No. 13/936,385 filed on Jul. 8, 2013, now U.S. Pat. No. 8,928,507, which makes reference to and claims priority to Provisional Application No. 61/668,813 filed on Jul. 6, 2012 Each of the above stated applications is hereby incorporated herein by reference in its entirety.

FIELD OF THE INVENTION

Certain embodiments of the invention relate to wireless communication. More specifically, certain embodiments of the invention relate to a method and system for time interleaved analog-to-digital converter timing mismatch estimation and compensation.

BACKGROUND OF THE INVENTION

Satellite television has advanced from an expensive hobbyist-only technology to a ubiquitous residential television service that rivals cable television, primarily due to reductions in the cost of satellite television reception technology.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for time interleaved analog-to-digital converter timing mismatch estimation and compensation substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 7 is a flow diagram illustrating exemplary steps in an aliasing compensation process, in accordance with an embodiment of the invention.

DETAILED DESCRIPTION OF THE INVENTION

Certain aspects of the invention may be found in a method and system for time interleaved analog-to-digital converter timing mismatch estimation and compensation. Exemplary aspects of the invention may comprise receiving an analog signal on a chip, converting the analog signal to a digital signal utilizing a time interleaved analog-to-digital-converter (ADC), and reducing a blocker signal that is generated by timing offsets in the time interleaved ADC by estimating complex coupling coefficients between a desired digital signal and the blocker signal utilizing a decorrelation algorithm on frequencies within a desired frequency bandwidth. The decorrelation algorithm may comprise a symmetric adaptive decorrelation algorithm. An amplitude of the blocker signal may be approximated as linear within the desired frequency bandwidth. The received analog signal may be generated by a calibration tone generator on the chip for a foreground estimation and compensation. A signal may be received from external to the chip for a background estimation and compensation. An aliased signal may be summed with an output signal from a multiplier. The complex coupling coefficients may be determined utilizing the decorrelation algorithm on the summed signals. The multiplier may be configured utilizing the determined complex coupling coefficients. The blocker signal in the time interleaved ADC may be canceled utilizing the configured multiplier. The time interleaved ADC may comprise two ADC paths with clock signals 180 degree phase difference. The timing offsets may comprise a deviation in the 180 phase difference. The timing offset may be estimated based on a ratio of amplitudes of a desired analog signal associated with the desired digital signal and an analog signal associated with the blocker signal. A timing mismatch for a plurality of frequency channels may be estimated utilizing the timing offset estimation and compensation circuitry.

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be implemented in hardware, software, firmware, or any combination of one or more thereof. As utilized herein, the term "exemplary" means serving as a non-limiting example, instance, or illustration. As utilized herein, the term "e.g.," introduces a list of one or more non-limiting examples, instances, or illustrations.

Figure 1:
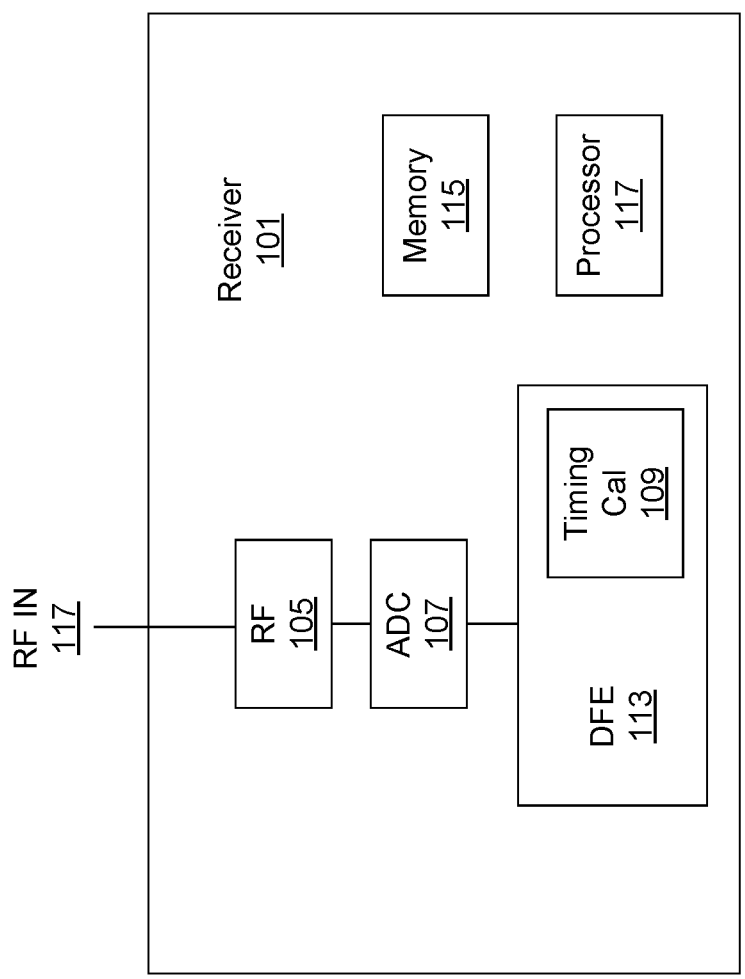
FIG. 1 is a diagram of an exemplary communication device with analog to digital converter timing offset estimation and compensation, in accordance with an embodiment of the invention.

FIG. 1 is a diagram of an exemplary communication device with time interleaved analog to digital converter timing offset estimation and compensation, in accordance with an embodiment of the invention. Referring to FIG. 1, there is shown a receiver 101 comprising a radio frequency (RF) module 105, an analog to digital converter (ADC) 107, a digital front end (DFE) 113, and a memory 115.

The receiver 101 may be in a transceiver, for example, and may be utilized for receiving satellite television signals, cable television signals, or any RF signal carrying multiple channels of data desired by a user. In an example scenario, the receiver 101 may comprise a set-top box. In this example, the receiver 101 may be operable to receive satellite, cable, or terrestrial television signals, down-convert and process the signals for communication to a display device, such as a television, for example.

The RF module 105 may comprise one or more RF receive (Rx) and transmit (Tx) paths for receiving signals from a satellite system, cable TV head-end, and/or terrestrial TV antennas, for example. The RF module 105 may comprise impedance matching elements, low-noise amplifiers (LNAs), power amplifiers, variable gain amplifiers, and filters, for example. The RF module 105 may thus be operable to receive, amplify, and filter RF signals before communicating them to the RF-to-baseband module 107.

The ADC 107 may comprise a wideband ADC and may be operable to convert received analog signals to digital signals. In an exemplary scenario, the ADC 107 may comprise a direct-sampled ADC and may comprise two parallel ADC paths, each sampling 180 degrees out of phase with each other, resulting in a total sampling rate that is double that of each individual path. For example, if each ADC path samples at 2.5 GHz, the resulting sampling rate for the signal communicated to the digital front end 113 is 5.0 GHz.

The timing calibration module 109 may comprise circuitry operable to de-correlate signals from the parallel ADC paths in the ADC 107. In an example scenario, the timing calibration module 109 may be integrated into the digital front end 113. In another example scenario, the timing calibration module 109 may be integrated in the processor 117. Slight timing mismatches in the clock signals for the ADC paths may result in image blocker signals when down-converted to baseband, for example. The timing calibration module 109 may determine a coefficient that is proportional to the timing offset between the two ADC path timing signals. This coefficient may then be utilized by the digital front end 113 to de-correlate the two desired signals from the undesired blocker signals. This process may be performed entirely in the digital circuitry without requiring complex analog circuitry or timing circuitry for the ADC paths.

The digital front end 113 may comprise circuitry for receiving the doublet samples from the ADC 107 and communicating them in a single data stream to the processor 117. The processor 117 may comprise a general purpose processor, such as a reduced instruction set computing (RISC) processor, for example, that may be operable to control the functions of the receiver 101. For example, the processor 117 may configure the timing calibration module 109 to determine offsets in timing signals for ADC paths. Additionally, the processor 117 may demodulate baseband signals received from the digital front end 113.

The memory 115 may comprise a programmable memory module that may be operable to store software and data, for example, for the operation of the receiver 101. Furthermore, the memory 115 may store the timing offset coefficients determined by the timing calibration module 109.

Receivers introduce undesirable impairments to a signal when the signal is being amplified, filtered or downconverted. For example, direct conversion receivers, which may also be referred to as "DCR", "zero IF receivers", or "ZIF receivers", are a very efficient way of implementing a radio receiver. However, they introduce a variety of impairments to a signal which can degrade overall performance of the system.

In an example scenario, in a time interleaved ADC, undesired image blocker signals may be generated when the ADC clock signals do not have 180 degrees phase difference. These undesired signals may be calibrated and compensated for in the receiver 101 utilizing decorrelation algorithms, such as symmetric adaptive decorrelation (SAD) algorithms, on received signals. Three favorable conditions for this reduction of noise signals are (1) full spectrum capture architecture, i.e. if it is desired to use the signals to cancel each other, both signals must be captured; (2) the two signals are on the same chip so that a large amount of information does not have to be passed between chips, which is the case in a time interleaved ADC on a chip; and (3) the ability to run the decorrelation algorithm (symmetric adaptive decorrelation and blind source separation, for example).

Furthermore, the same process may be used for estimation in foreground mode using a calibration tone, and background mode using an actual RF input signal. Implementation variants include using one or more modes (foreground and/or background) and not necessarily both. For example, a calibration tone may be used to measure the nominal timing mismatch in foreground mode, and an input signal may be used in background mode to track any drift due to temperature, voltage, or other factors affecting the ADC timing mismatch.

The compensation method may comprise a narrowband or wideband correction logic using multi-tap filters in time domain or equivalently in frequency domain (e.g., using Fourier transform techniques), to apply frequency-dependent correction once the timing mismatch is known.

In the case of multiple channel operation, for example, in a full spectrum capture system, a shared hardware circuit that can be employed in round-robin fashion on different channels may be used to estimate the optimal correction values, since the coupling from blockers is a function of frequency.

The decorrelation may operate on narrow band slices of the entire frequency band or may operate on the entire wide band frequency range. The gain and phase coefficients may then be determined for each signal to subtract the undesired signal in the digital domain.

Figure 2:
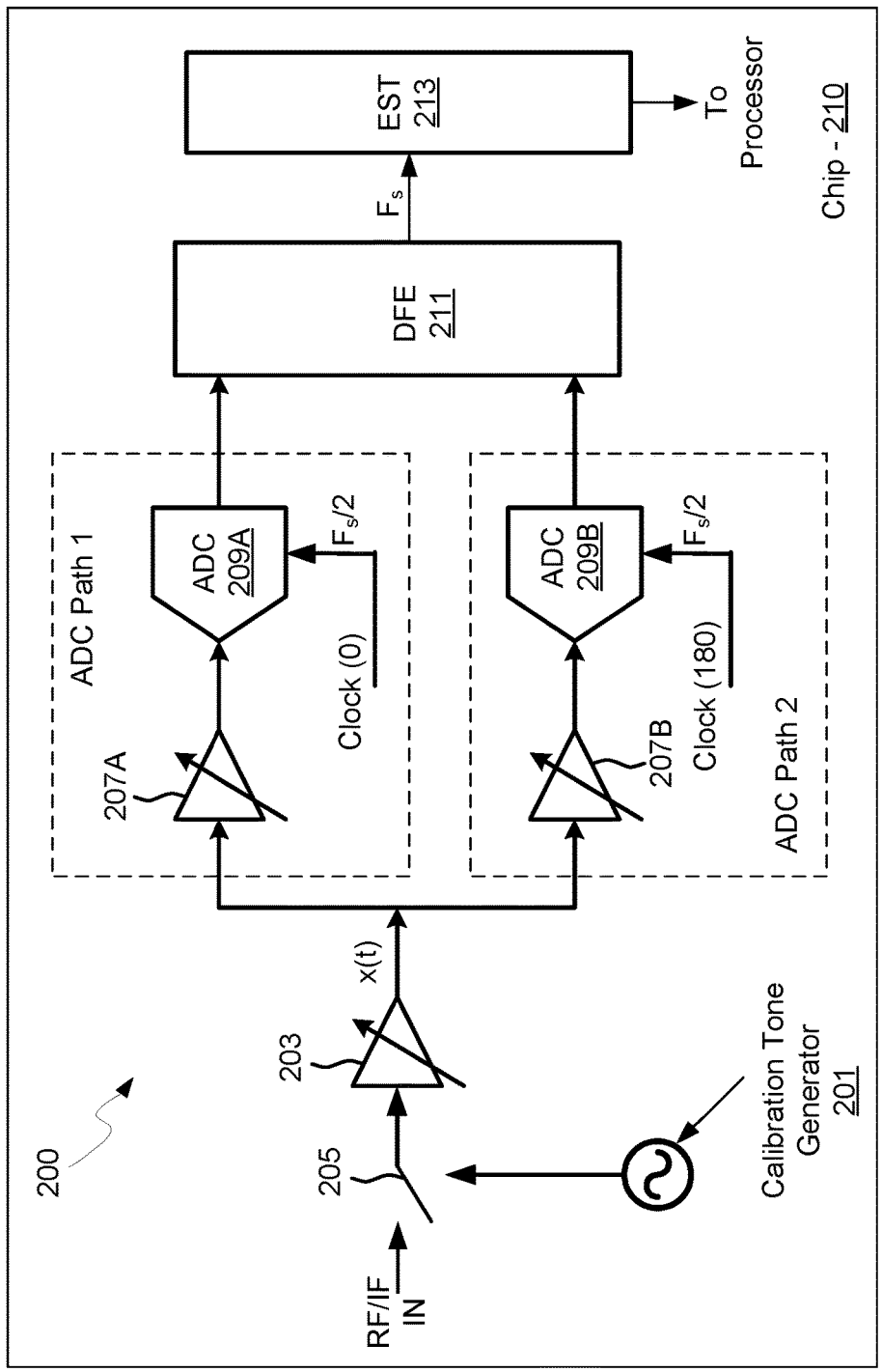
FIG. 2 is a diagram illustrating an exemplary analog to digital converter with two paths, in accordance with an embodiment of the invention.

FIG. 2 is a diagram illustrating an exemplary time interleaved analog to digital converter with two paths, in accordance with an embodiment of the invention. Referring to FIG. 2, there is shown a time interleaved ADC 200 on a chip 210 comprising a shared buffer stage 203 and separate paths, ADC path 1 and ADC path 2, for sampling a received analog signal. Each of the ADC paths 1 and 2 may comprise a gain stage 207A/207B and an ADC 209A/209B with an input clock signal, clock (0) and clock (180). In an example scenario, the input clock (0) signal may be at 2.5 GHz and 180 degrees out of phase with the clock (180) signal, resulting in a 5.0 GHz sampling rate at the digital front end (DFE) 211. Furthermore, the gain stages 207A/207B may be variable gain or a fixed gain.

There is also shown a calibration tone generator 201 for applying a calibration tone to the time interleaved ADC 200. The calibration tone may be utilized to determine the offset in the timing signals communicated to the ADCs in each ADC path 1 and 2. Timing offsets may be process-dependent and may be essentially static, such that a calibration made using a calibration tone may then be applied to signals received during normal operation of the receiving device.

However, thermal changes in the chip 210 may affect the timing offset, so the aliasing compensation may also operate dynamically and thus operate on normal received signals during operation. The switch 205 may comprise a CMOS switch, for example, and may be operable to switch between the RF/IF input and the calibration tone generator 201 for background and foreground calibration, respectively.

The shared buffer 203 may comprise a gain stage for the ADC paths, which may communicate buffered signals to each of the gain modules 207A and 207B in the ADC paths 1 and 2. The gain modules 207A and 207B may comprise amplifiers for amplifying the buffered signals. The gain modules 207A and 207B may comprise configurable gain levels that may be controlled by a processor, or may comprise fixed gain levels, for example.

The ADCs 209A and 209B may comprise circuitry that is operable to convert analog input signals to digital output signals by making discrete samples of an analog signal resulting in a digital representation of the analog signal. The frequency of the sampling may be configured by the frequency of the clock input to the ADCs 209A and 209B, and in an example scenario may be at least twice the frequency of the analog signal to be converted. Accordingly, the ADCs 209A and 209B may receive analog signals from the gain stages and may generate digital signals to be communicated to the digital front end 211 before being communicated to the timing offset estimation module 213.

In instances where the clock (0) signal and clock (180) signal are not exactly 180 degrees out of phase, images of blocker signals at alias frequencies may interfere with the desired signal output. Furthermore, it should be noted that the invention is not necessarily limited to two ADC paths and may comprise any number of paths depending on the timing offsets between paths and the decorrelation processing capabilities, for example.

The timing offset estimation module 213 may comprise suitable circuitry, logic, and/or code that may be operable to determine complex coupling coefficients between desired and undesired signals that may be aliased to the same frequency range due to timing mismatch in the time interleaved ADC 200. The timing offset between time interleaved ADC clocks may be estimated, which may be utilized to determine correction factors for filters, or multipliers, to cancel aliased signals. The multipliers, e.g., single or multi-tap filters, may be utilized to cancel the aliased signals.

The digital front end 211 may comprise circuitry that is operable to receive the doublet samples from the ADC paths 1 and 2 and combine them to a single data stream to be communicated to a processor, such as the processor 117. Accordingly, the digital front end 211 may switch between ADC outputs at a sampling frequency, $F_s$. The output signal may then comprise a digitized signal at twice the sampling frequency of the ADCs 209A and 209B, the digitized signal being communicated to the timing offset estimation module 213 before being communicated to a processor that may process received digital signals to demodulate, and/or perform other processing techniques to the data. Furthermore, the processor may perform timing calibration and compensation for offsets in the timing signals clock (0) and clock (180) of the ADCs 209A and 209B.

In an exemplary scenario, the timing offset calibration and compensation process may be performed with a calibration signal from the calibration tone generator 201 or may be dynamically configured during normal operation. The frequency of the calibration signal may result in blocker signals falling within the bandwidth of the receiver. Furthermore, the calibration and compensation may be performed entirely in the digital domain, thereby inducing no overhead in the RF/analog domain.

To calibrate and compensate for timing offset, the process may approximate the frequency dependency of the amplitude of the image blocker signal over a desired channel bandwidth as linear, determining a timing offset and a filter coefficient or multiplier.

In an exemplary scenario, the calibration process may be based on symmetric adaptive decorrelation (SAD) algorithms to estimate the coefficient over a certain bandwidth, although any signal decorrelation algorithm may be used. The SAD method estimates the complex coupling coefficients between the desired and blocker signals and the coupling coefficients may then be deduced in an iterative process.

The compensation method may comprise a narrowband correction logic or a wideband logic using multi-tap filters in time domain or equivalently using frequency domain techniques using Fourier transform to apply frequency-dependent correction once the timing mismatch is known.

Figure 3:
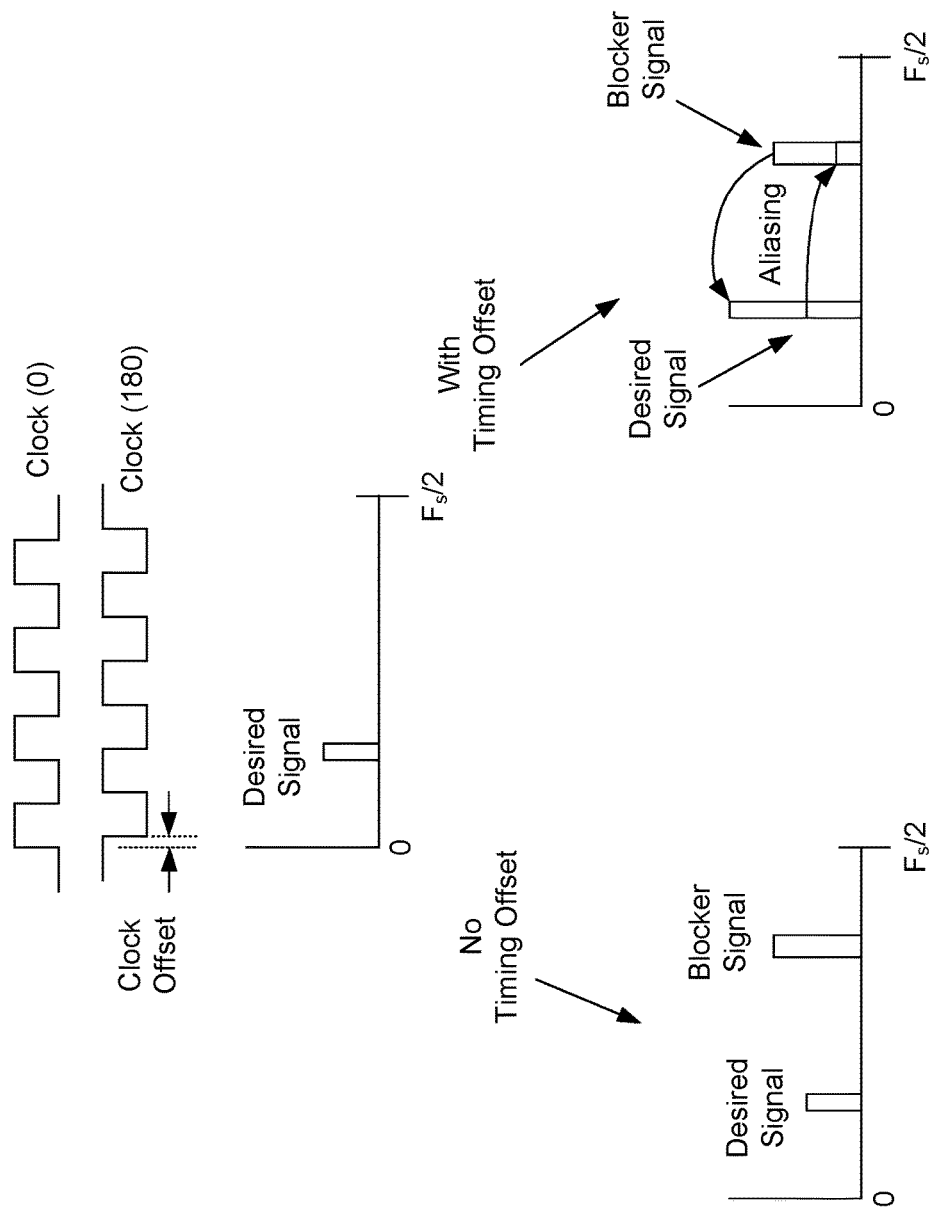
FIG. 3 is a diagram illustrating alias signals from blockers resulting from timing offsets in a time interleaved analog to digital converter, in accordance with an embodiment of the invention.

FIG. 3 is a diagram illustrating alias signals from blockers resulting from timing offsets in a time interleaved analog to digital converter, in accordance with an embodiment of the invention. Referring to FIG. 3, there is shown a clock (0) signal and a clock (180) signal, which in an ideal case are exactly 180 degrees out of phase. However, in real circuits, non-uniformities in devices across a chip may result in timing offsets between clock signals, which in a time interleaved ADC may result in aliasing of blocker signals onto the desired signals, as illustrated in the lower plots. The lower left plot shows the idealized case with no aliasing of the blocker signal onto the desired signal, whereas the lower right plot shows aliasing of the blocker signal onto the desired signal when the clock signals are not exactly 180 degrees out of phase.

In an example scenario, the desired signal may be extracted from the received signal, which comprises both the desired signal and the blocker signal, through decorrelation techniques, such as symmetric adaptive decorrelation or blind source separation, for example. The complex coupling coefficients between signals may be determined utilizing these techniques, and the desired signal extracted utilizing the determined coefficients. In this manner, timing offsets may be mitigated in the digital domain without the need for complex timing circuitry for minimizing offsets.

Aliasing of signals due to timing mismatch/offset may be modeled using the following relations:

$$X(\omega) = \underbrace{K_1(\omega)S(\omega) + K_2(\frac{\omega_S}{2} - \omega)I^*(-\omega)}_{Desired+Blocker's\ image} +$$

$$\underbrace{K_1(\frac{\omega_S}{2} - \omega)I(\frac{\omega_S}{2} - \omega) + K_2(\omega)S^*(\omega - \frac{\omega_S}{2})}_{Blocker+Desired's\ image}$$

where $S(\omega)$ is the desired channel, $I(\omega)$ is the blocker, and $\omega$ represents frequency. The coupling coefficients may be a function of frequency are given by:

$$X(\omega) = \underbrace{K_1(\omega)S(\omega) + K_2\left(\frac{\omega_S}{2} - \omega\right)I^*(-\omega)}_{\text{Desired+Blocker's image}} +$$

$$\underbrace{K_1\left(\frac{\omega_S}{2} - \omega\right)I\left(\frac{\omega_S}{2} - \omega\right) + K_2(\omega)S^*\left(\omega - \frac{\omega_S}{2}\right)}_{\text{Blocker+Desired's image}}$$

Figure 4:
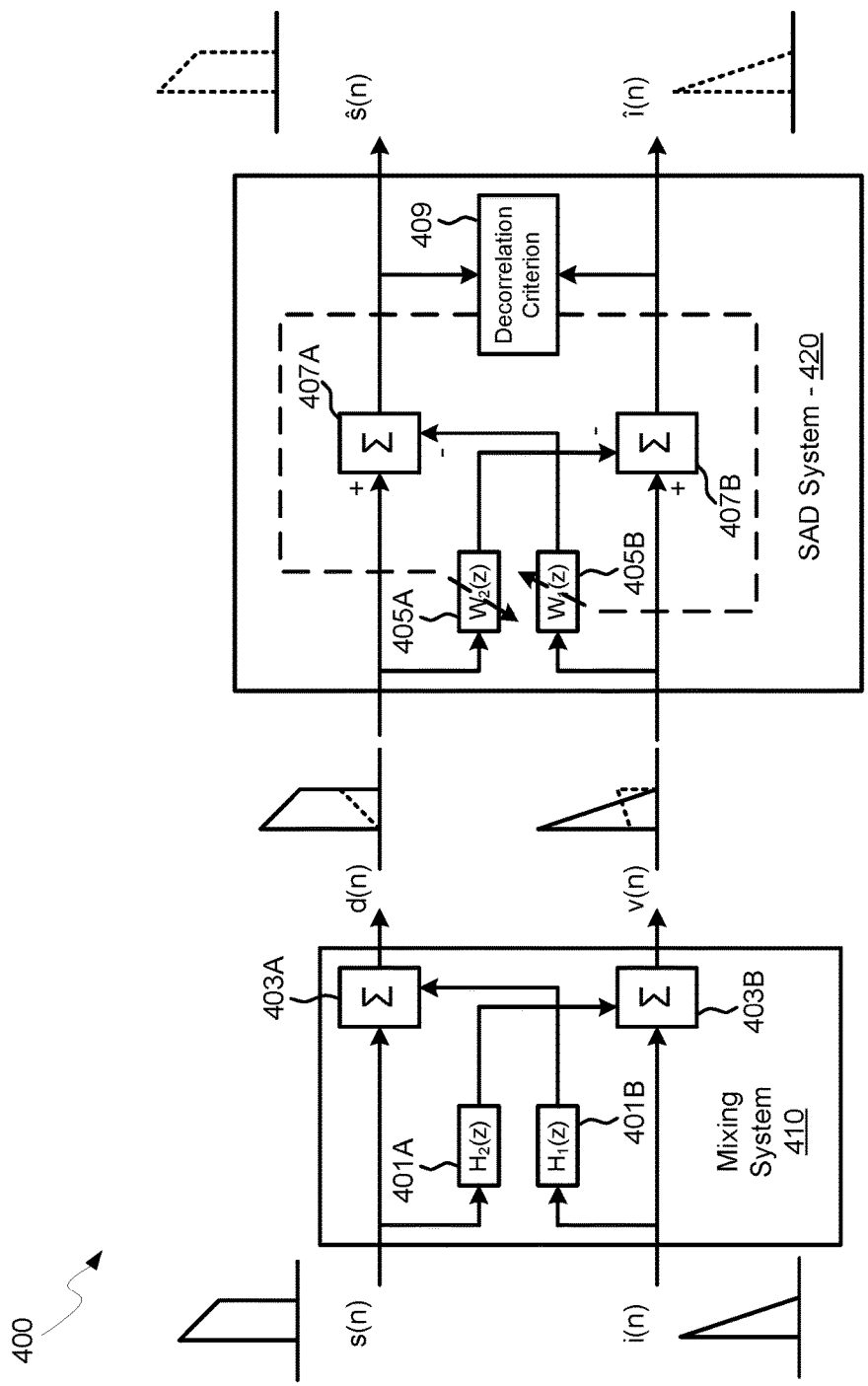
FIG. 4 is a diagram illustrating exemplary ADC timing offset estimation and compensation circuitry, in accordance with an embodiment of the invention.

Once the coupling coefficients are known, they may be compensated for in subsequent processing, thereby extracting the desired signal while ignoring the blocker signal, as described further with respect to FIG. 4.

FIG. 4 is a diagram illustrating exemplary ADC timing offset estimation and compensation circuitry, in accordance with an embodiment of the invention. Referring to FIG. 4, there is shown an alias correction system 400 comprising a mixing system 410 and a symmetric adaptive decorrelation (SAD) system 420. There is also shown input signals s(n) and i(n), which are the desired signal and the blocker image signal, respectively; intermediate signals d(n) and v(n), which are the down-converted desired and blocker signals, respectively; and ŝ(n) and î(n), which are the desired decorrelated signal output and the decorrelated blocker signal output, respectively. The signal and image, s(n) and i(n) may be communicated to the alias correction system 400 from a crossbar, for example. The components in FIG. 4 may operate exclusively in the digital domain, or partially in the analog domain and partially in the digital domain.

The mixing system 410 is a representation of aliasing mechanisms in a down-conversion process, and comprises a pair of coupling multipliers 401A and 401B that are cross-coupled to the summers 403A and 403B to indicate the aliasing of signals in the mixing process. Accordingly, the output signals of the mixing system 410 comprise the sum of the expected signals, i.e., s(n) and i(n) summed with an image of the other signal, as illustrated by the output signals d(n) and v(n).

The symmetric adaptive decorrelation system 420 may comprise adaptive multipliers, or filters, 405A and 405B that are cross-coupled to the summers 407A and 407B, and a decorrelation module 409. The summers 407A and 407B may comprise circuitry that is operable to add a plurality of input signals and output a combined output signal. In this manner, an appropriate input signal may be injected to cancel out unwanted signals.

The decorrelation module 409 may comprise circuitry, logic, and/or code that is operable to determine coupling coefficients between received signals, which may comprise one or more undesired blocker signals aliased onto desired signals due to timing mismatch in a time interleaved ADC, for example. Accordingly, once the complex coupling coefficients are determined, the decorrelation module 409 may be operable to configure the multipliers 405A and 405B, which may generate output signals that may cancel blocker signals when added to the other input signal at the summer 407A or 407B. While two separate multipliers 405A and 405B are shown, a simpler approach may utilize a single multiplier, such as a single tap filter with the single output communicated to both summers 407A and 407B, which is as described in the mathematical formulations below.

In an example scenario, the output signals d(n) and v(n) from the mixing system 410 may be communicated to the symmetric adaptive decorrelation system 420. The summers 407A and 407B may sum the received signals with a multiplier signal, $W_1(z)$ and $W_2(z)$, which may be configured by the decorrelation module 409.

The SAD algorithm assumes that desired and undesired signals are uncorrelated, which is represented by the following relation:

$$E[s(k)i(k-m)]=0$$

where E is an expectation operator and s(k) is the desired signal and i(k) is the image of the undesired signal.

The mixing of these signals may cause aliasing of signals into the same frequency range, resulting in blocker signals. The decorrelation algorithm therefore decorrelates the desired signal from the aliased image of the undesired channel such that the estimates are uncorrelated:

$$E[\hat{s}(k)\hat{i}(k-m)]=0$$

$$E[\hat{i}(k)\hat{s}(k-m)]=0$$

A simplified model for the aliased signals assumes a linear multiplier:

$$d(n) = K_{11}s(n) + K_{22}i^*(n)$$

$$v(n) = K_{12}i(n) + K_{21}s^*(n)$$

where $$K_{12} = \frac{1}{2}\left(1 + e^{-j\left(\frac{\omega_S}{2}-\omega 0\right)\Delta t}\right)$$

$$K_{22} = \frac{1}{2}\left(1 - e^{j\left(\frac{\omega_S}{2}-\omega 0\right)\Delta t}\right)$$

and $\omega 0 = 2\pi f 0$

The cancellation of aliasing may be accomplished using two separate 1-tap filters:

$$\hat{s}(n)=d(n)-w_1 \cdot v^*(n)$$

$$\hat{i}(n)=v(n)-w_2 \cdot d^*(n)$$

which leads to:

$$\hat{s}(n)=(K_{11}-w_1 K^*_{21})s(n)+(K_{22}-w_1 K^*_{12})i^*(n)$$

$$\hat{i}(n)=(K_{12}-w_2 K^*_{22})i(n)+(K_{21}-w_2 K^*_{11})s^*(n)$$

And solving for the optimal filter values:

$$w_1 = \frac{K_{22}}{K_{12}} \approx K_{22}, \quad w_2 = \frac{K_{21}}{K^*_{11}} \approx K_{21}$$

since $K_{12} \approx 1 \approx K_{11}$

In an example scenario, the timing mismatch may be estimated in a narrow band stage, which may be achieved utilizing a least mean squares update of cancellation filter coefficients, $w_1$ and $w_2$, utilizing the relation:

$$w(k+1)=w(k)+2\mu(m)\hat{s}(k)\hat{i}(k)$$

where m is the step size, or bandwidth, of the update loop. Then the correction values may be programmed in a wide-band stage in the receiver system.

Furthermore, as a special case, a single converged filter coefficient w can be used to estimate the timing mismatch given by a root of a quadratic equation, which may be closely approximated by:

$$w \approx \frac{K_{21} + GK_{22}}{1+G} \left\} \begin{array}{l} G \gg 1, w \approx K_{22} \\ G \ll 1, w \approx K_{21} \end{array}\right.$$

where $$G = 10^{-\frac{DU}{10}}$$

G represents the DU ratio (in dB) between the actual desired and undesired signals before aliasing, which may be measured with a received signal strength indicator (RSSI) detector, for example. The timing mismatch may then be computed using the converged filter value and the estimate of actual DU between the signal and the blocker, as shown below:

$$\Delta t \approx \frac{2(1+G) \times \mathrm{Im}(w)}{2\pi \left(G\frac{f_s}{2} - (G-1)f_0\right)}$$

where $f_s$ is the sampling frequency in Hz, $f_0$ is the desired channel center frequency in Hz, and $\mathrm{Im}(w)$ represents imaginary part of w.

The timing mismatch may be estimated differently for different ranges of DU. For moderate absolute values of DU, such as less than or equal to 10 dB, the timing mismatch may be approximated by:

$$\Delta t \approx \frac{(1+G) \times \mathrm{Im}(w)}{\pi \times \left(G\frac{f_s}{2} - (G-1)f_0\right)}$$

For cases with a strong blocker, for example if DU is less than −10 dB, the timing mismatch may be approximated by:

$$\Delta t \approx \frac{\mathrm{Im}(w)}{\pi \left(\frac{f_s}{2} - f_0\right)}$$

And for cases with a strong desired signal, such as when DU is greater than 10 dB, the timing mismatch may be approximated by:

$$\Delta t \approx \frac{\mathrm{Im}(w)}{\pi \times f_0}$$

Once $\Delta t$ is known, the decorrelation module 409 may program the multiplier 405A and 405B with the correction values, or multipliers, $W_2(z)$ and $W_1(z)$, or a single value, w, for a single output multiplier for the desired channel as:

$$w_{opt} \approx -j\pi\left(\frac{f_s}{2} - f_0\right)\Delta t$$

This optimal correction value $w_{opt}$ may then be applied to the received signals and communicated to the summers 407A and 407B to cancel out the undesired signals, resulting in the representations ŝ(n) and î(n) of the original signals s(n) and i(n).

Figure 5:
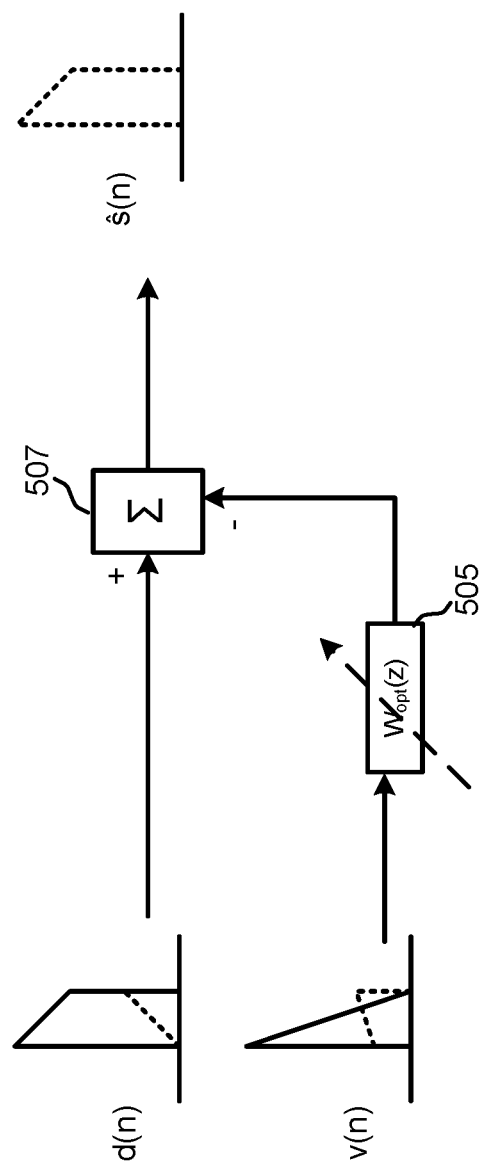
FIG. 5 is a diagram illustrating exemplary ADC timing offset compensation-only circuitry in time-domain, in accordance with an embodiment of the invention.

FIG. 5 is a diagram illustrating exemplary ADC timing offset compensation-only circuitry in time-domain, in accordance with an embodiment of the invention. Referring to FIG. 5, there is shown a multiplier 505 and a summer 507. There is also shown input signals d(n) and v(n) and output signal ŝ(n). FIG. 5 illustrates the compensation blocks of the symmetric adaptive decorrelation system 420 described with respect to FIG. 4, and shows the compensation process in the time domain, in contrast to that of FIG. 6, which is in the frequency domain.

Figure 6:
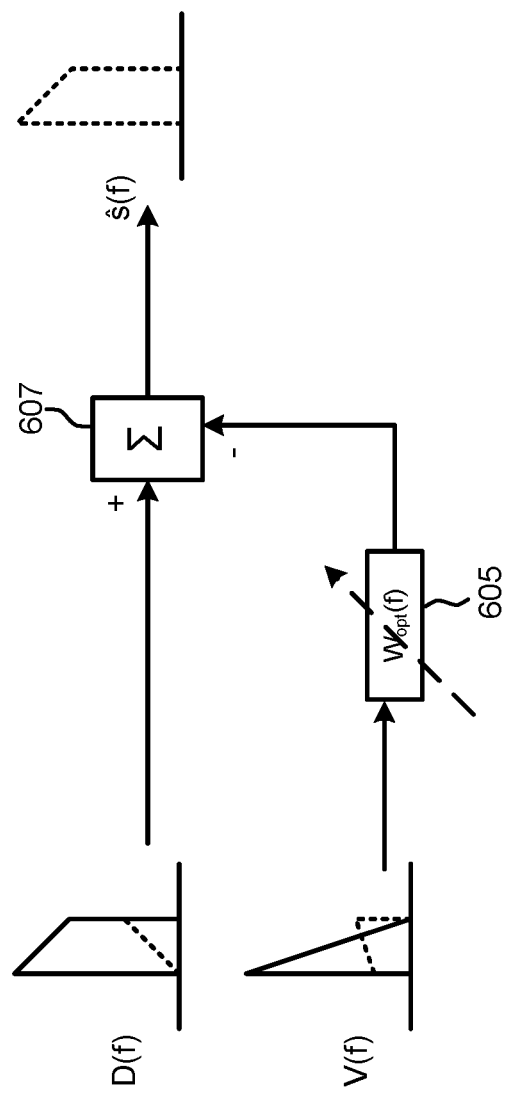
FIG. 6 is a diagram illustrating exemplary ADC timing offset compensation-only circuitry in frequency-domain, in accordance with an embodiment of the invention.

FIG. 6 is a diagram illustrating exemplary ADC timing offset compensation-only circuitry in frequency-domain, in accordance with an embodiment of the invention. Referring to FIG. 6, there is shown a multiplier 605 and a summer 607, similar to the multiplier 505 and summer 507 of FIG. 5, except that they operate in the frequency domain, showing the flexibility in the compensation process. There is also shown input signals D(f) and V(f) and output signal ŝ(f). FIG. 6 illustrates the compensation blocks of the symmetric adaptive decorrelation system 420 described with respect to FIG. 4 but operating in the frequency domain.

FIG. 7 is a flow diagram illustrating exemplary steps in an aliasing compensation process, in accordance with an exemplary embodiment of the invention. Referring to FIG. 7, there is shown a process flow starting with start step 701 followed by step 703 where a calibration tone is generated for a foreground estimation and compensation or a regular signal is received for a background estimation and compensation. In step 705, the timing mismatch estimation may be initiated followed by step 707 where the the correction coefficient, such as the multiplier w described above, may be read from the alias cancellation algorithm.

The ratio of the signal strengths of the desired to undesired signals may be measured to compute DU in step 709, which may be utilized to determine the appropriate relation to determine the timing mismatch in step 711, followed by end step 713.

In an embodiment of the invention, a method and system may comprise receiving an analog signal on a chip 210, converting the analog signal to a digital signal utilizing a time interleaved analog-to-digital-converter (ADC) 200, and reducing a blocker signal that is generated by timing offsets in the time interleaved ADC 200 by estimating complex coupling coefficients between a desired digital output signal and the blocker signal utilizing a decorrelation algorithm on frequencies within a desired frequency bandwidth. The decorrelation algorithm may comprise a symmetric adaptive decorrelation algorithm. An amplitude of the blocker signal may be approximated as linear within the desired frequency bandwidth.

The received analog signal may be generated by a calibration tone generator 201 on the chip 220 for a foreground estimation and compensation. A signal may be received from external to the chip for a background estimation and compensation. Aliased signals may be summed with an output signal from a multiplier 405A/405B. The complex coupling coefficients may be determined utilizing the decorrelation algorithm on the summed signals. The multiplier 405A/405B may be configured utilizing the determined complex coupling coefficients. The blocker signal in the time interleaved ADC 200 may be canceled utilizing the configured multiplier 405A/405B. The time interleaved ADC 200 may comprise two ADC paths, ADC path 1 and ADC path 2, with clock signals, clock (0) and clock (180) that have 180 degree phase difference. The timing offsets may comprise a deviation in the 180 phase difference.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for time interleaved analog-to-digital converter timing mismatch estimation and compensation.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:
    receiving an analog signal on a chip;
    converting the analog signal to a digital signal utilizing a time interleaved analog-to-digital-converter (ADC), wherein said converting results in a desired digital signal and a blocker signal;
    determining complex coupling coefficients between said desired digital signal and said blocker signal using a decorrelation algorithm in circuitry in said chip; and
    reducing said blocker signal using said determined complex coupling coefficients.

2. The method according to claim 1, wherein the decorrelation algorithm comprises a symmetric adaptive decorrelation algorithm.

3. The method according to claim 1, comprising approximating an amplitude of said blocker signal as linear within a desired frequency bandwidth.

4. The method according to claim 1, comprising performing a foreground estimation and timing offset compensation by generating the received analog signal utilizing a calibration tone generator on said chip.

5. The method according to claim 1, comprising performing a background estimation and timing offset compensation utilizing an analog signal received from external to said chip.

6. The method according to claim 5, comprising estimating a change in said timing offset utilizing the background estimation and compensation.

7. The method according to claim 1, comprising summing the blocker signal with an output signal from a multiplier.

8. The method according to claim 7, comprising determining said complex coupling coefficients utilizing said decorrelation algorithm on said summed signals.

9. The method according to claim 8, comprising determining a timing offset in said time interleaved ADC utilizing said determined complex coupling coefficients.

10. The method according to claim 9, comprising configuring said multiplier with a value determined from said determined timing offset.

11. The method according to claim 1, comprising cancelling said blocker signal utilizing the configured multiplier.

12. The method according to claim 1, wherein said time interleaved ADC comprises two ADC paths with clock signals with 180 degree phase difference.

13. The method according to claim 1, comprising estimating a timing offset in said time interleaved ADC based on a ratio of amplitudes of a desired analog signal associated with said desired digital signal and an analog signal associated with the blocker signal.

14. The method according to claim 1, comprising estimating a timing mismatch for a plurality of frequency channels utilizing said circuitry.

15. A system for wireless communication, the system comprising:
    one or more circuits on a chip comprising a time interleaved analog-to-digital-converter (ADC), wherein said one or more circuits are operable to:
    receive an analog signal on said chip;
    convert the analog signal to a digital signal utilizing said time interleaved ADC, wherein said converting results in a desired digital signal and a blocker signal;
    determine complex coupling coefficients between said desired digital signal and said blocker signal using a decorrelation algorithm; and
    reduce said blocker using said complex coupling coefficients.

16. The system according to claim 15, wherein the decorrelation algorithm comprises a symmetric adaptive decorrelation algorithm.

17. The system according to claim 15, wherein said one or more circuits are operable to approximate an amplitude of said blocker signal as linear within a desired frequency bandwidth.

18. The system according to claim 15, wherein said one or more circuits are operable to perform a foreground estimation and timing offset compensation by generating the received analog signal utilizing a calibration tone generator on said chip.

19. The system according to claim 15, wherein said one or more circuits are operable to perform a background estimation and timing offset compensation utilizing an analog signal received from external to said chip.

20. The system according to claim 19, wherein said one or more circuits are operable to estimate a change in said timing offset utilizing the background estimation and compensation.

* * * * *